(12) United States Patent
Haruhana et al.

(10) Patent No.: US 6,611,042 B2
(45) Date of Patent: Aug. 26, 2003

(54) SEMICONDUCTOR DEVICE INCLUDING RESISTORS ISOLATED AND EQUDISTANT FROM DIFFUSION REGIONS

(75) Inventors: Hideyo Haruhana, Tokyo (JP); Yutaka Uneme, Tokyo (JP); Seiji Yamamoto, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/971,588

(22) Filed: Oct. 9, 2001

(65) Prior Publication Data

US 2002/0171111 A1 Nov. 21, 2002

(30) Foreign Application Priority Data

May 17, 2001 (JP) ........................................ 2001-147478

(51) Int. Cl.[7] .............................................. H01L 29/00
(52) U.S. Cl. ........................ 257/536; 257/516; 257/541
(58) Field of Search ................................ 257/536, 541, 257/516, 537

(56) References Cited

U.S. PATENT DOCUMENTS

| | | | | | |
|---|---|---|---|---|---|
| 5,498,899 | A | * | 3/1996 | Palara | 257/536 |
| 5,500,553 | A | * | 3/1996 | Ikegami | 257/536 |
| 5,567,977 | A | * | 10/1996 | Jimenez | 257/536 |
| 2001/0030364 | A1 | * | 10/2001 | Katon | 257/536 |
| 2002/0014672 | A1 | * | 2/2002 | Noble et al. | 257/413 |

FOREIGN PATENT DOCUMENTS

| | | | |
|---|---|---|---|
| JP | 08-279608 | * | 10/1996 |
| JP | 10-189879 | | 7/1998 |

* cited by examiner

Primary Examiner—Phat X. Cao
(74) Attorney, Agent, or Firm—Leydig, Voit & Mayer, Ltd.

(57) ABSTRACT

In a semiconductor substrate, at least one diffusion region exists between resistors on an element isolation layer, and the resistors and the diffusion regions are arranged such that all distances between the respective resistors and the diffusion regions around the corresponding resistors are equal.

16 Claims, 12 Drawing Sheets

THE SAME PATTERN

THE SAME PATTERN

THE SAME PATTERN

THE SAME PATTERN

THE SAME PATTERN

THE SAME PATTERN

PRIOR ART ic SEMICONDUCTOR DEVICE INCLUDING RESISTORS ISOLATED AND EQUDISTANT FROM DIFFUSION REGIONS

FIELD OF THE INVENTION

The present invention relates a semiconductor device in which a plurality of resistors having the same characteristics are formed on an element isolation layer at a high accuracy while suppressing variations of the respective characteristics.

BACKGROUND OF THE INVENTION

In a conventional semiconductor device, as shown in FIG. 17, the surface of a silicon substrate 1 is selectively oxidized to obtain a field oxide film 3a serving as a dioxide silicon layer. This region has been used as a region for element isolation.

However, with micropatterning of elements in recent years, an element isolation layer called an STI (Shallow Trench Isolation) which can be designed to be accurate has been used. The outline of a method of manufacturing the STI is shown in FIG. 18A to FIG. 18F.

As shown in FIG. 18A to FIG. 18F, a protective film 2 is stacked on a silicon substrate 1 shown in FIG. 18A (FIG. 18B). The protective film 2 is selectively etched to obtain a structure in FIG. 18C. Etching is performed by using the protective film 2 as a mask to form a trench in the silicon substrate 1 as shown in FIG. 18D. Subsequently, a silicon oxide film 3 is deposited by plasma CVD or the like to obtain a structure shown in FIG. 18E. Finally, the resultant structure is subjected to a polishing process such as CMP (Chemical Mechanical Polish) to obtain a structure shown in FIG. 18F.

Even though an element isolation region obtained by the field oxide film 3a is an isolation region having a wide area as shown in FIG. 17, a structure in which the thickness of the central portion and the thickness of the peripheral portion are almost equal to each other is difficult to obtain because of the nature of the manufacturing method. In contrast to this, since the element isolation layer region obtained by the STI is subjected to the polishing process such as the CMP, a relatively wide area (e.g., 10 μm×10 μm or more) has a characteristic structure in which the central portion is thinner than, i.e., dented relative to, the peripheral portion.

However, in such an element isolation region obtained by the STI, a new problem which is not posed in a conventional field oxide film has been posed. More specifically, when a plurality of resistors having the same characteristics are to be formed on an element isolation layer region having a relatively wide area, as shown in FIG. 19A and FIG. 19B, focus is offset by the positions of the resistors in a photolithographic operation because of the dent described above. Therefore, the resistors vary in size, and it is difficult to form a plurality of resistors having the same characteristics with a high accuracy.

SUMMARY OF THE INVENTION

It is an object of the present invention to provide a semiconductor device in which a plurality of resistors having the same characteristics are formed at a high accuracy on an element isolation layer region formed by a polishing process such as STI.

According to the semiconductor device of one aspect of the present invention, a plurality of resistors having the same characteristics are formed on an element isolation layer, at least one diffusion region exists between one resistor and a resistor adjacent thereto, and the plurality of resistors and the diffusion regions are arranged such that all distances between the respective resistors and the diffusion regions around the corresponding resistors are equal to each other.

According to the semiconductor device of another aspect of the present invention, a plurality of resistors having the same characteristics are formed on an element isolation layer, at least one metal wiring layer exists between one resistor and a resistor adjacent thereto, and the plurality of resistors and the metal wiring layers are arranged such that all distances between the resistors and the metal wiring layers around the corresponding resistors are equal to each other.

Other objects and features of this invention will become apparent from the following description with reference to the accompanying drawings.

BRIEF DESCRIPTION OF THE DRAWINGS

FIG. 18A to FIG. 18F are sectional views showing the steps of forming an element isolation layer by conventional STI.

DESCRIPTION OF THE PREFERRED EMBODIMENTS

Preferred embodiments of the semiconductor device according to the present invention will be described in detail below while referring to the accompanying drawings.

A first embodiment of the present invention will be described below with reference to FIG. 1 to FIG. 4.

Figure 1:
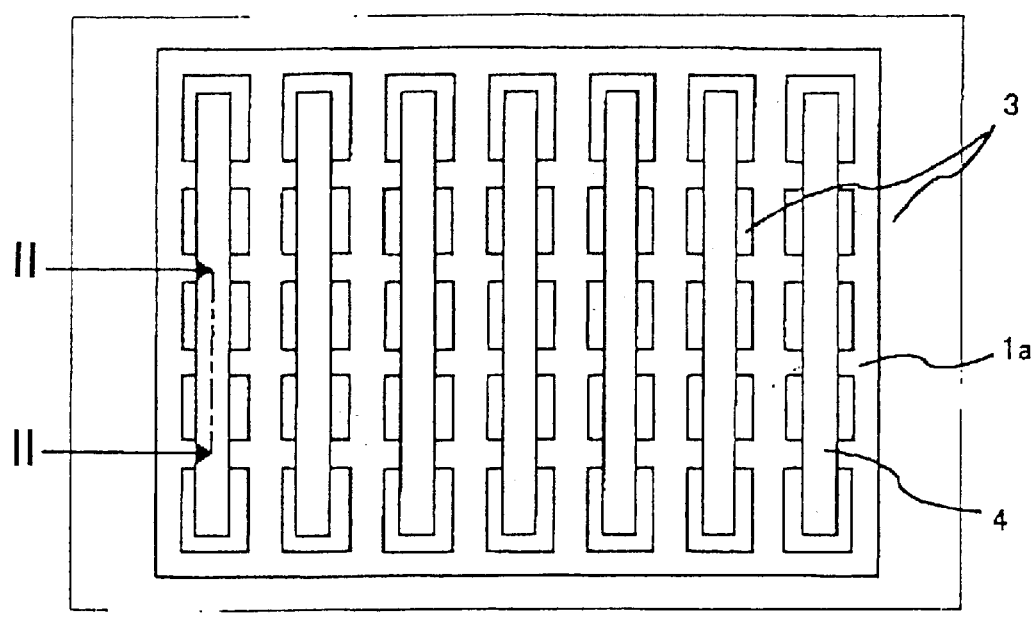
FIG. 1 is a plan view showing a semiconductor device according to a first embodiment.
Figure 2:
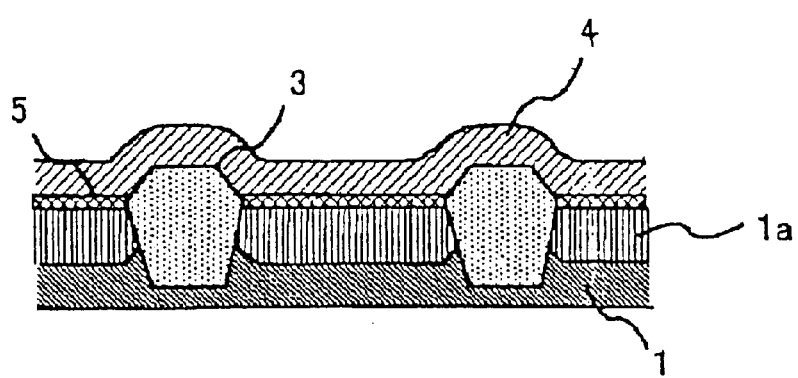
FIG. 2 is a sectional view showing the semiconductor device according to the first embodiment.

In FIG. 1 and FIG. 2, reference numeral 1 denotes a silicon substrate, reference numeral 1a denotes a diffusion region in which an n-type or p-type impurity is diffused in the silicon substrate 1, and reference numeral 3 denotes a silicon oxide film. As the silicon oxide film 3, an element isolation layer is formed by STI. Reference numeral 4 denotes resistors. The plurality of resistors 4 have the same characteristics, i.e., the same resistances and the same parasitic resistances. Reference numeral 5 denotes a gate oxide film. FIG. 2 is a sectional view showing the semiconductor device along a line II—II in FIG. 1.

As a conventional element isolation layer region, the silicon oxide film 3 is formed on the entire surface of the resultant structure. In FIG. 1, the silicon oxide film 3 for forming the element isolation layer region is divided, and the diffusion regions 1a exist between the divided silicon oxide films 3. The resistors 4 are formed on the diffusion regions 1a through the silicon oxide films 3 and the gate oxide film 5 like an array.

Figure 18A:
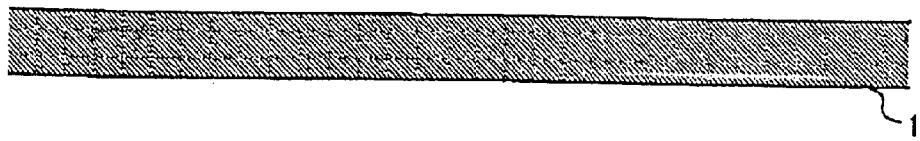
Figure 18B:
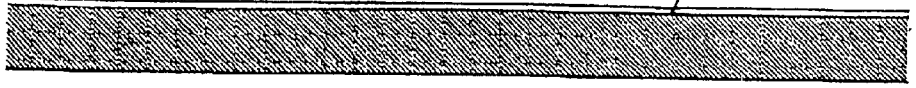
Figure 18B:
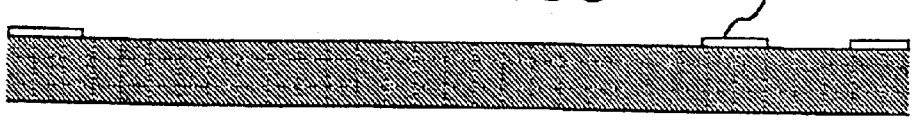
Figure 18B:
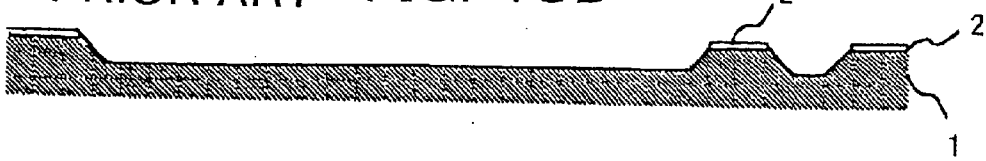
Figure 18B:
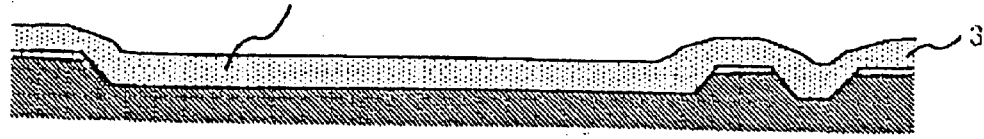
Figure 18B:
Figure 19A:
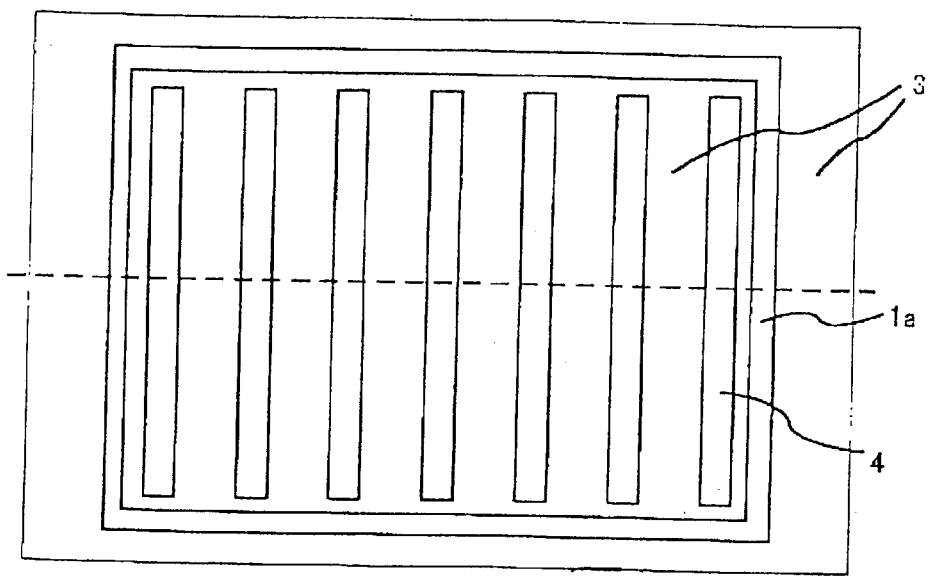
FIG. 19A and FIG. 19B are a plan view and a sectional view showing resistors formed on an element isolation layer formed by the conventional STI.
Figure 19B:
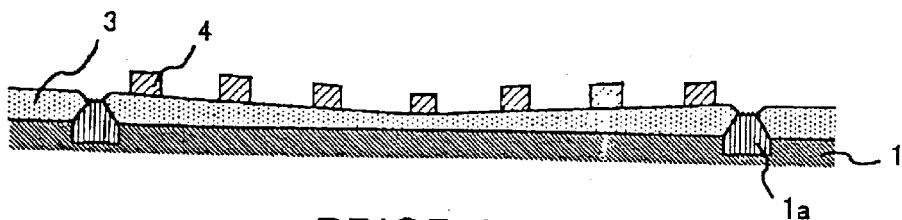

Even though the silicon oxide films 3 formed as described above are formed in a relatively large region having a size of 10 $\mu$m×10 $\mu$m or larger by a conventional STI manufacturing method, the central portion of the element isolation layer region is not dented. More specifically, at the step in FIG. 18E, a portion which will be the diffusion region 1a serves as a columnar resistant layer for a polishing step such as CMP to prevent the central portion of the element isolation layer region from being excessively dented. For this reason, as the resistors 4 formed on the silicon oxide films 3, the plurality of resistors 4 having the same characteristics being free from variations of the sizes caused by the offset of focuses in a photolithographic operation can be accurately formed.

Figure 4:
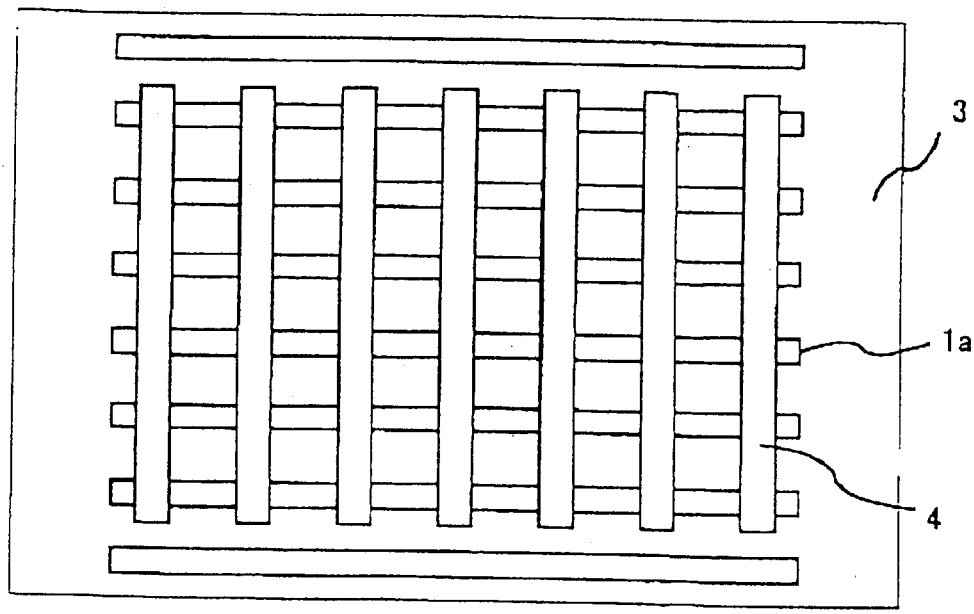
FIG. 4 is a plan view showing the semiconductor device according to the first embodiment.

However, it is important in this case that the resistors 4 cannot be accurately formed even though the diffusion regions 1a are simply arranged between the silicon oxide films 3. More specifically, the parasitic resistances are different from each other by the differences of the distances between the respective resistors 4 and the diffusion regions 1a, and the resistors 4 accurately have the same characteristics. Therefore, in consideration of the parasitic resistances, the respective resistors 4 of the plurality of resistors must be arranged such that all the distances between the resistors 4 and the corresponding diffusion regions 1a around the corresponding resistors 4 are equal to each other. FIG. 1 and FIG. 4 show configurations obtained by the above consideration.

The effect obtained by making the peripheral environments of the diffusion regions 1a between the resistors 4 equal to each other is not limited to the resistors on the element isolation layer formed by the polishing process such as STI. The effect also acts when the resistors 4 having the same characteristics are formed on the upper sides of conventional field oxide films.

Figure 3:
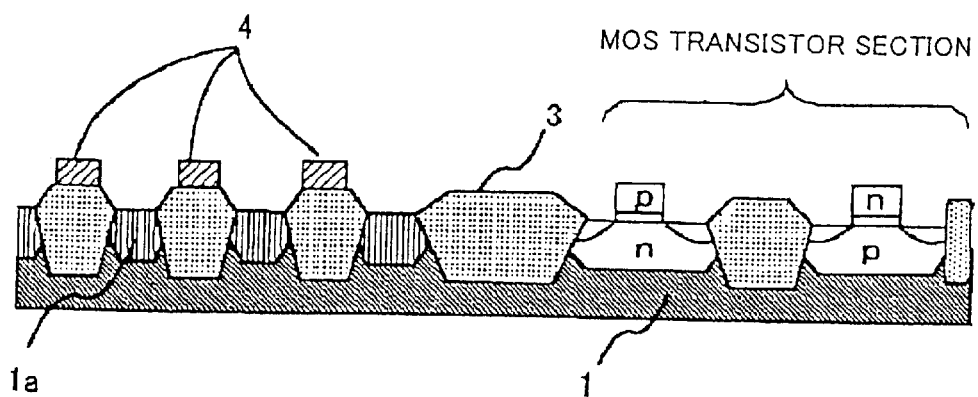
FIG. 3 is a sectional view simulatedly showing the semiconductor device according to the first embodiment.

FIG. 3 is a sectional view simulatedly showing an concrete arrangement of the plurality of resistors 4 of the present application shown in FIG. 1. In FIG. 3, although a MOS transistor is illustrated as a transistor, an IC can be similarly constituted by a bipolar transistor.

A basic configuration in FIG. 4 is almost the same as that in FIG. 1. However, the configuration in FIG. 4 is different from the configuration in FIG. 1 in that the diffusion region 1a is the plurality of elongated region; and the plurality of resistors 4 are arranged on the element isolation layers to cross the plurality of diffusion regions 1a. Also in such an arrangement, as in the configuration shown in FIG. 1, variations of sizes caused by an offset of focuses in a photolithographic operation are small. Therefore, the resistors 4 having small variations of resistances and having characteristics that parasitic resistances are equal to each other.

A second embodiment of the present invention will be described below with reference to FIG. 5.

Figure 5:
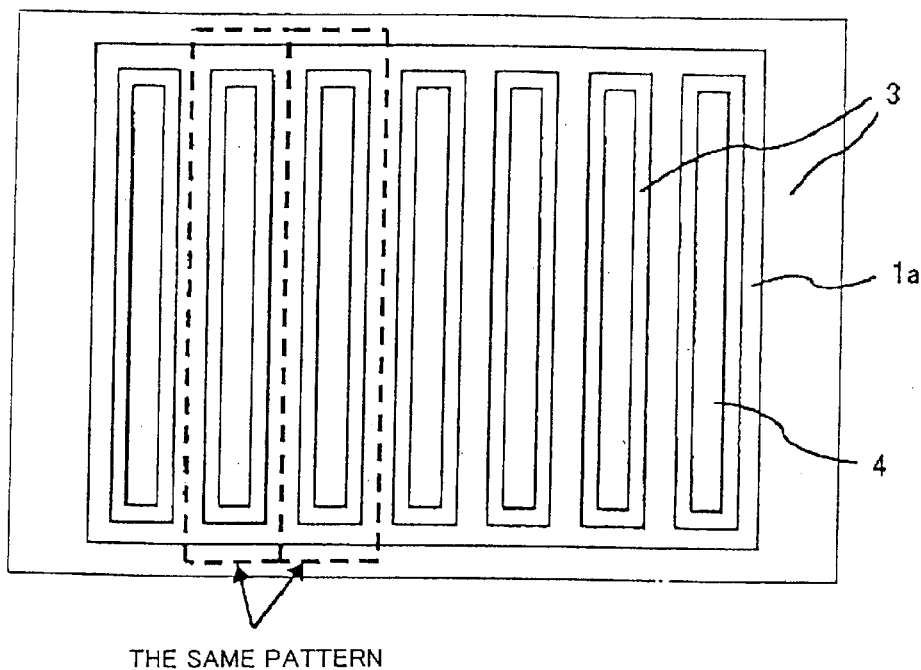
FIG. 5 is a plan view showing a semiconductor device according to a second embodiment.

In FIG. 5, all resistors 4 are formed on the upper sides of silicon oxide films 3, and are arranged such that the resistors 4 do not overlap a diffusion region 1a unlike the configurations shown in FIG. 1 and FIG. 4. The diffusion region 1a is formed to surround the resistors 4. In this manner, the resistors 4 are prevented from being adversely affected by the parasitic transistors formed in the configurations in FIG. 1 and FIG. 4. Also in this configuration, as in the first embodiment, the resistors 4 having small variations of sizes caused by an offset of focuses in a photolithographic operation and, therefore, having small variations of resistances can be obtained. In consideration of the respective resistors 4, the resistors 4 are constituted in the same patterns such that the distances between the resistors 4 and the diffusion region 1a around the corresponding resistors are equal to each other. For this reason, the resistors 4 having characteristics that parasitic resistances are almost equal to each other can be accurately formed.

Since the periphery of the resistors 4 is entirely surrounded by the diffusion region 1a, dents in a polishing process are rarely formed on the silicon oxide films 3.

In FIG. 5, when a structure in which the polarities of the resistors 4, the diffusion region 1a surrounding the resistors 4, and an impurity of wells (not shown) under the resistors 4 and the diffusion region 1a are made equal to each other is used, the resistors 4 are surrounded by the low-resistance diffusion region 1a having a small area to suppress the potentials of the wells under the element isolation layer regions in which the resistors 4 are arranged from varying, and the influence of noise transmitted from the silicon substrate 1 to the resistors 4 can be reduced.

A third embodiment of the present invention will be described below with reference to FIG. 6.

Figure 6:
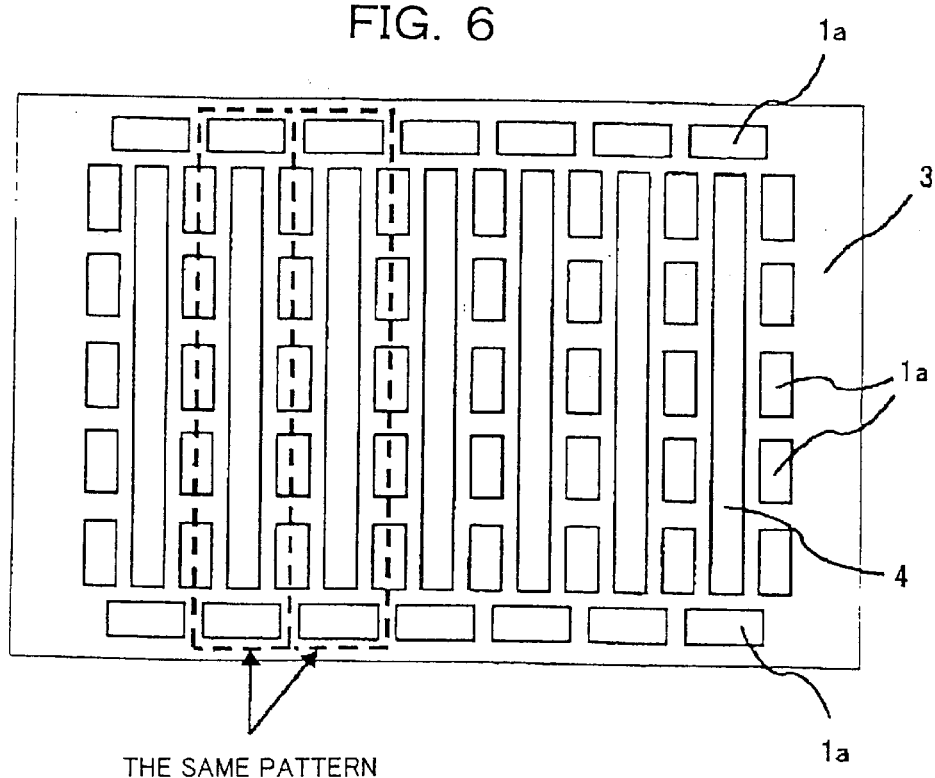
FIG. 6 is a plan view showing a semiconductor device according to a third embodiment.

In FIG. 6, as in FIG. 5, diffusion regions 1a are arranged to surround resistors 4. However, the structure in FIG. 6 is different from the structure in FIG. 5 in that the diffusion region 1a is a plurality of parts. Even in this configuration, the resistors 4 having small variations of sizes caused by an offset of focuses in a photolithographic operation, therefore, having small variations of resistances can be obtained. In observation about the respective resistors 4, the resistors 4 are constituted to have the same patterns such that distances between the resistors 4 and diffusion regions 1a around the corresponding resistors are equal to each other. For this reason, the resistors 4 having characteristics that parasitic resistances are almost equal to each other can be accurately formed.

In addition, since the peripheries of the resistors 4 are almost entirely surrounded by the diffusion regions 1a, it is advantageous that dents are rarely formed in a polishing process.

A fourth embodiment of the present invention will be described below with reference to FIG. 7 and FIG. 8.

Figure 7:
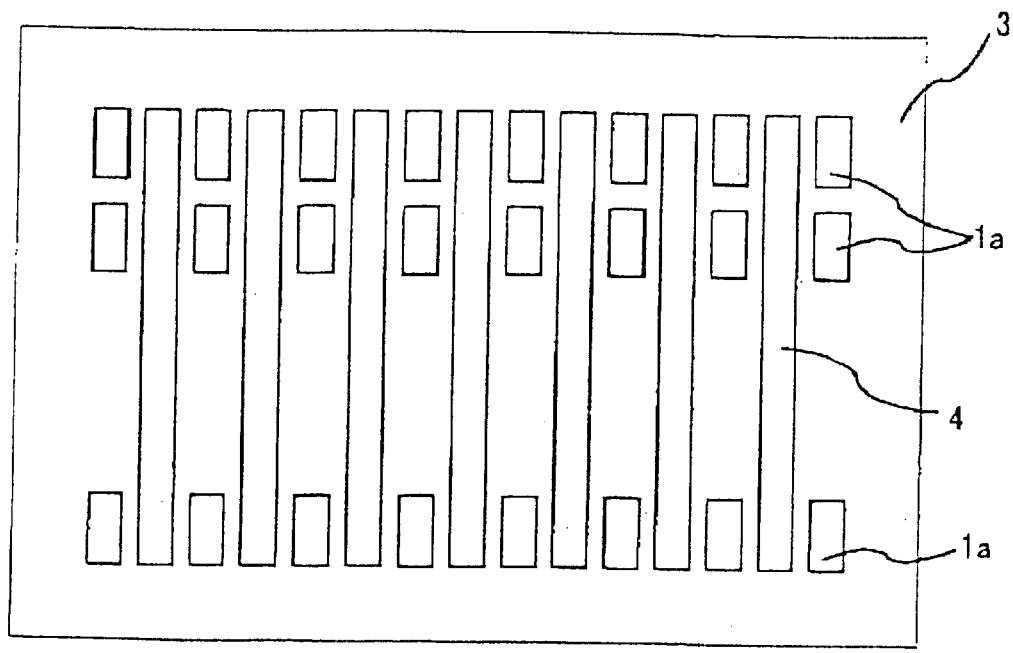
FIG. 7 is a plan view showing a semiconductor device according to a fourth embodiment.
Figure 8:
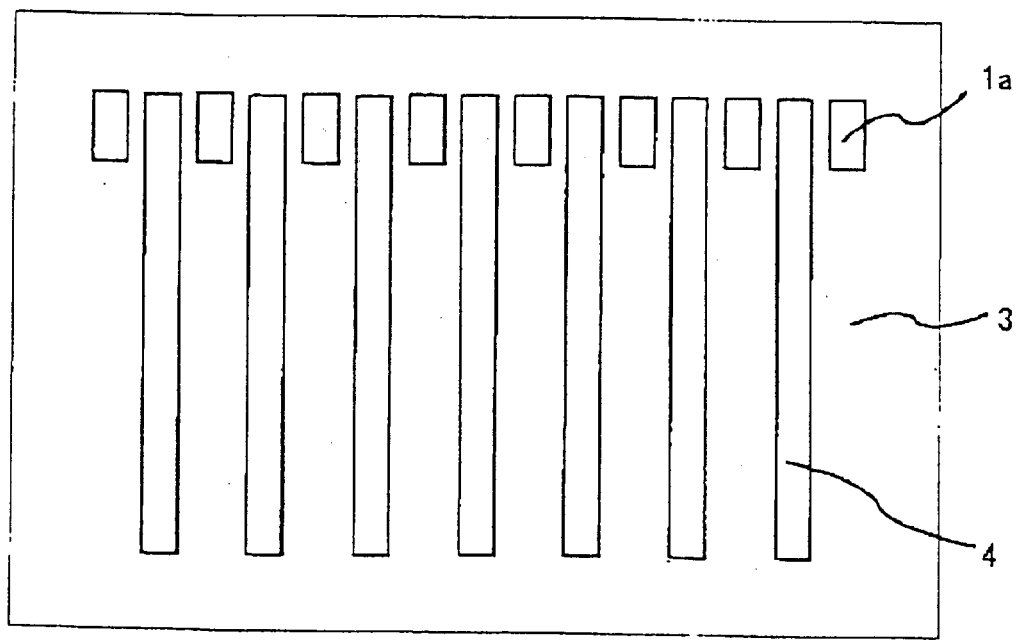
FIG. 8 is a plan view showing the semiconductor device according to the fourth embodiment.

The configurations in FIG. 7 and FIG. 8 are basically the same as that in FIG. 6. However, when respective resistors 4 and diffusion regions 1a around the corresponding resistors are observed, point symmetrical patterns in which patterns are not changed even though the patterns are vertically inverted are employed in the case in FIG. 6. In contrast to this, in FIG. 7 and FIG. 8, point symmetrical patterns are not employed. Even in these patterns, the resistors 4 having small variations of sizes caused by an offset of focuses in a photolithographic operation and, therefore, small variations of resistances can be obtained. In observation about the respective resistors 4, since the resistors 4 are constituted to have the same patterns such that distances between the resistors 4 and the diffusion regions 1a therearound are equal to each other, the resistors 4 having characteristics that parasitic resistances are almost equal to each other can be accurately formed.

A fifth embodiment of the present invention will be described below with reference to FIG. 9 to FIG. 12.

In the fifth embodiment, although each of the above embodiments illustrates the configuration in which the resistors 4 are arranged on the element isolation layer such that the distances between the respective resistors 4 and the diffusion regions 1a around the corresponding resistors are equal to each other, a plurality of resistors 4 are considered at once. More specifically, the respective resistors 4 are considered as sub-resistors, and a resistor obtained by connecting a plurality of sub-resistors in series with each other or in parallel to each other is considered as a main resistor. A plurality of main resistors are arranged on an element isolation layer such that patterns each constituted by the main resistor and a diffusion region 1a therearound are the same as each other.

Figure 9:
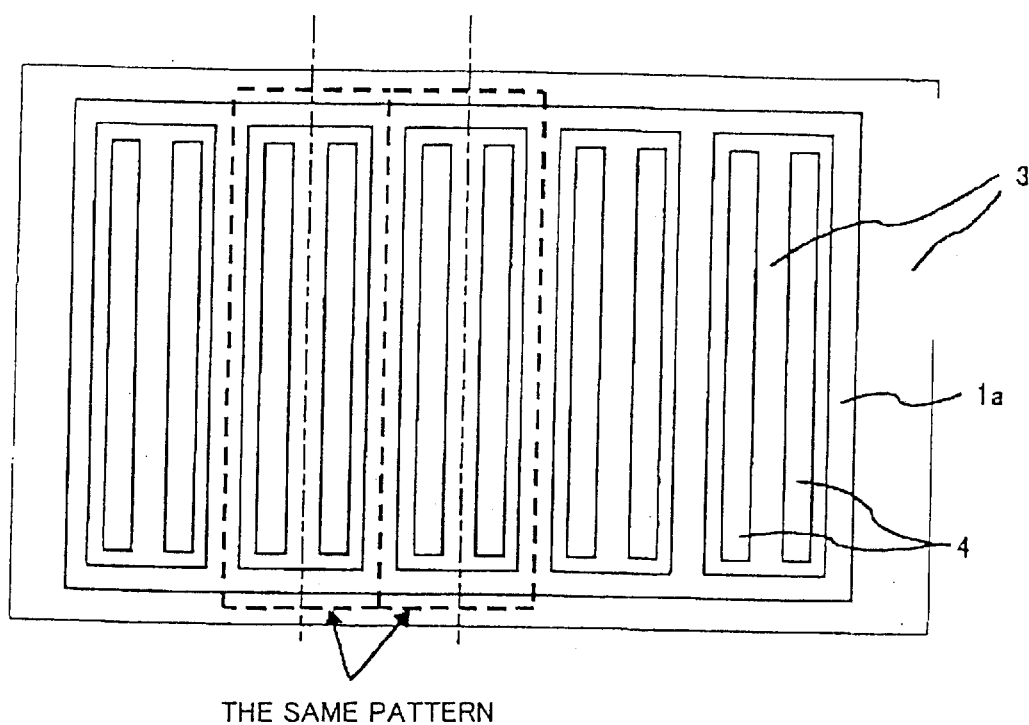
FIG. 9 is a plan view showing a semiconductor device according to a fifth embodiment.

FIG. 9 shows a configuration in which main resistors each constituted by arranging two sub-resistors 4 having the same shapes in axisymmetry are surrounded by an diffusion region 1a.

Figure 10:
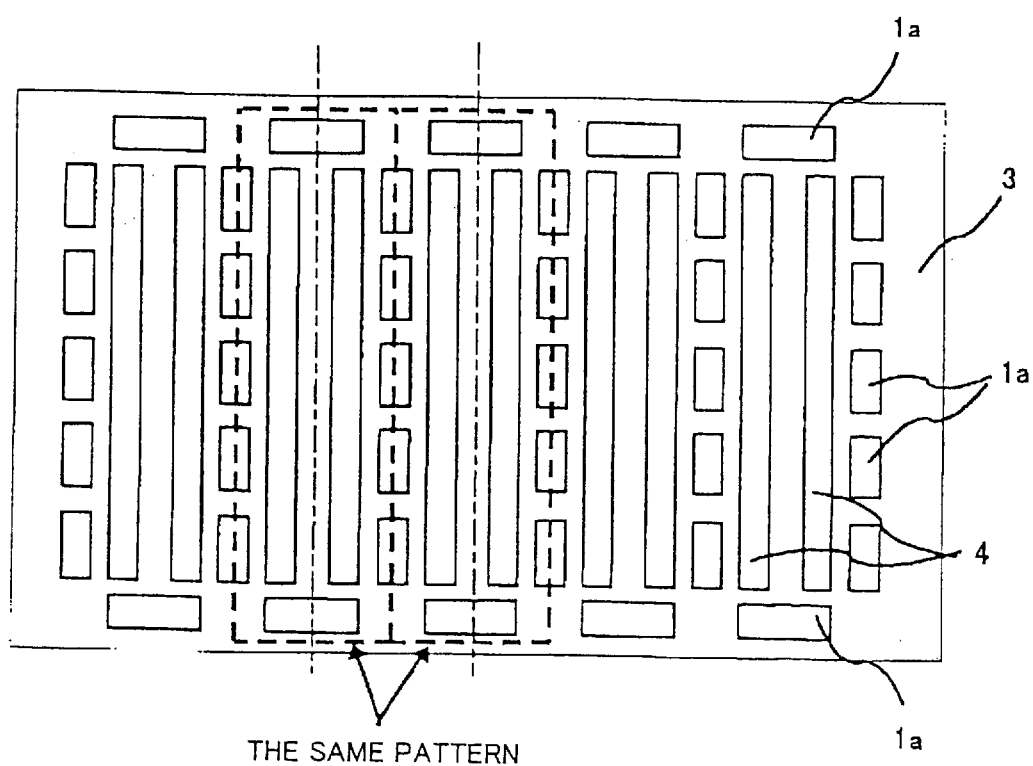
FIG. 10 is a plan view showing the semiconductor device according to the fifth embodiment.

FIG. 10 is obtained by further dividing the peripheral diffusion region in FIG. 9.

Figure 11:
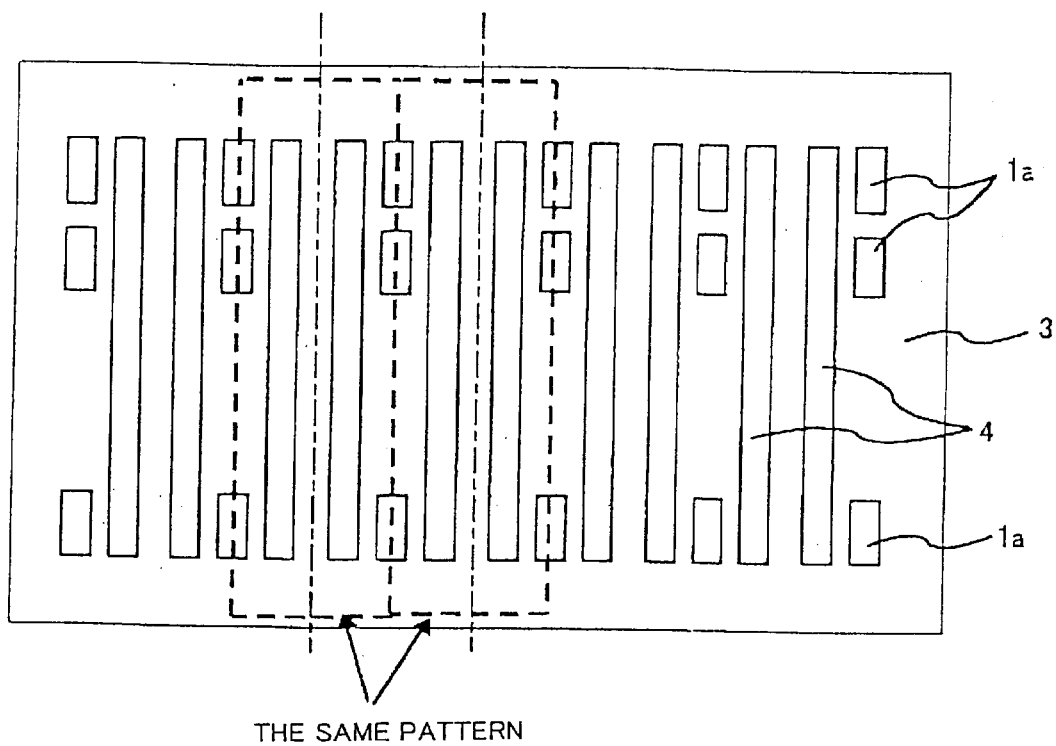
FIG. 11 is a plan view showing the semiconductor device according to the fifth embodiment.
Figure 12:
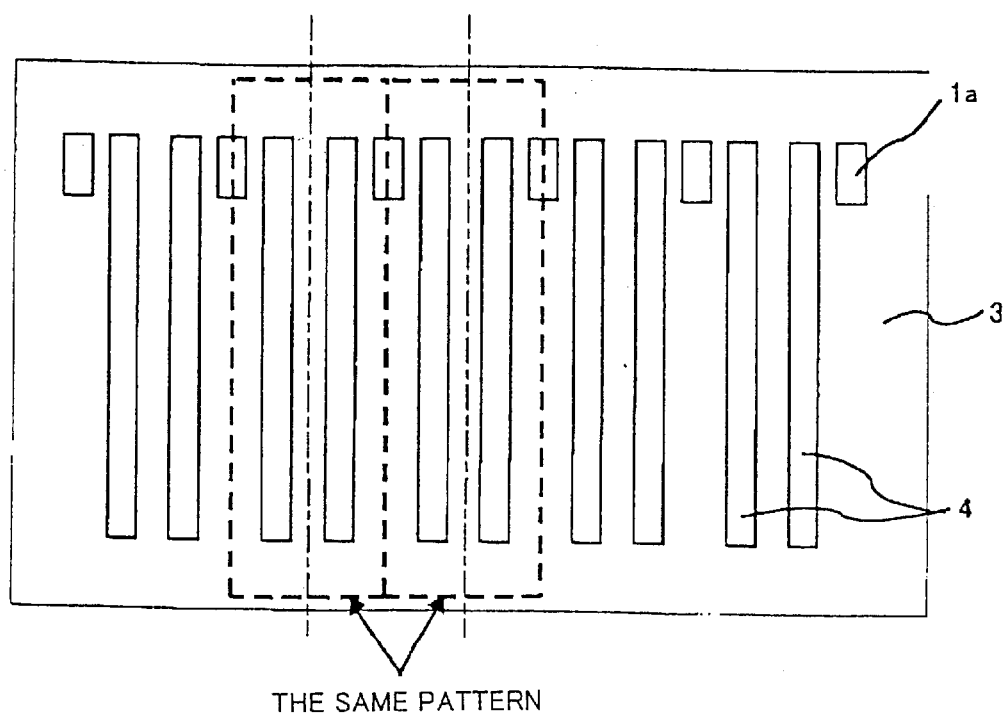
FIG. 12 is a plan view showing the semiconductor device according to the fifth embodiment.

FIG. 11 and FIG. 12 show states in which the patterns of the main resistors in FIG. 10 are not point symmetrical. In FIG. 9 to FIG. 12, although two sub-resistors 4 constitute a main resistor, three or more sub-resistors 4 may constitute a main resistor as a matter of course.

In FIG. 9 to FIG. 12, the main resistors having small variations of sizes caused by an offset of focuses in a photolithographic operation and, therefore, small variations of resistances can also be obtained. In consideration of the main resistors, since all the resistor of the plurality of main resistors are constituted by the same patterns such that the distances between the resistors and the diffusion regions 1a around the corresponding resistors are equal to each other, the main resistors having characteristics that parasitic resistances are almost equal to each other can be accurately formed. However, at this time, when the plurality of sub-resistors have the same shapes or are symmetrical, the resistors can be more accurately formed. In addition, since the main resistors are constituted by the plurality of resistors 4, resistances can be freely exactly set, and the degree of freedom of the design of the resistors is improved.

In FIG. 9 to FIG. 12, when a structure in which the polarities of the main resistors, the diffusion regions 1a therearound, and the impurity of the well under the main resistors and the diffusion regions 1a are made equal to each other is employed, the main resistors are surrounded by the low-resistance diffusion regions 1a having a small area to suppress the potential of the well under the element isolation layer region in which the main resistors are arranged from varying, and the influence of noise transmitted from the silicon substrate 1 to the main resistors can be reduced.

A sixth embodiment of the present invention will be described below with reference to FIG. 13A and FIG. 13B and FIG. 14A and FIG. 14B.

Figure 13A:
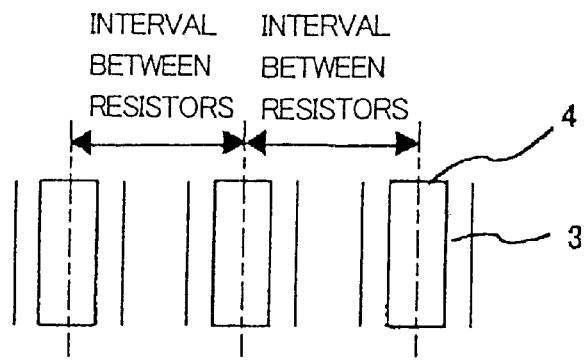
FIG. 13A and FIG. 13B are a plan view and a sectional view showing a semiconductor device according to a sixth embodiment.
Figure 13B:
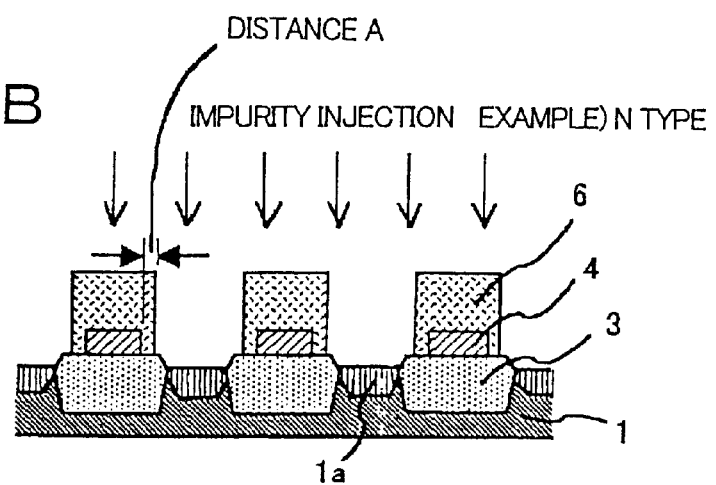
Figure 13B:
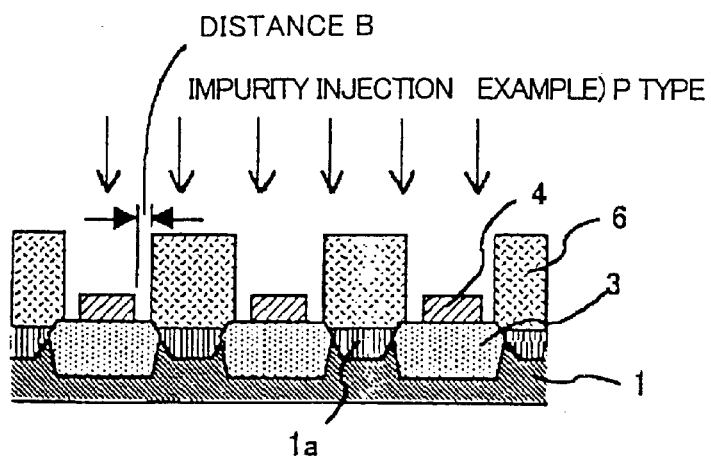
Figure 14A:
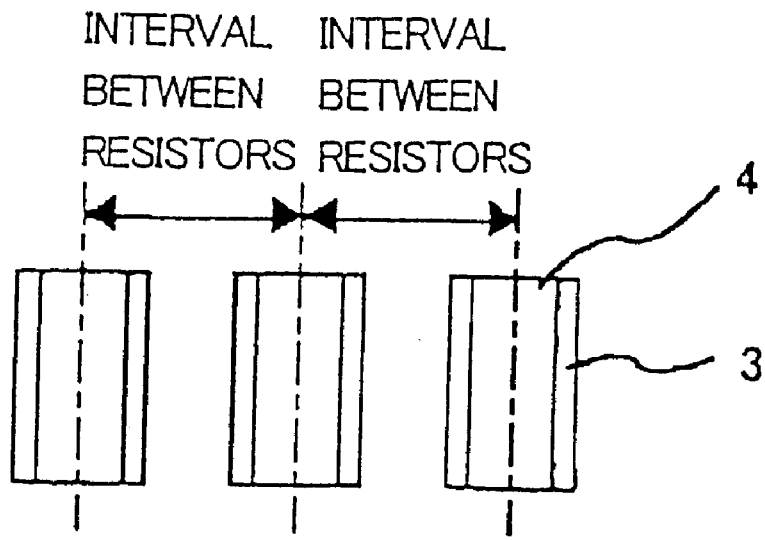
FIG. 14A and FIG. 14B are a plan view and a sectional view showing a semiconductor device according to a sixth embodiment.
Figure 14B:
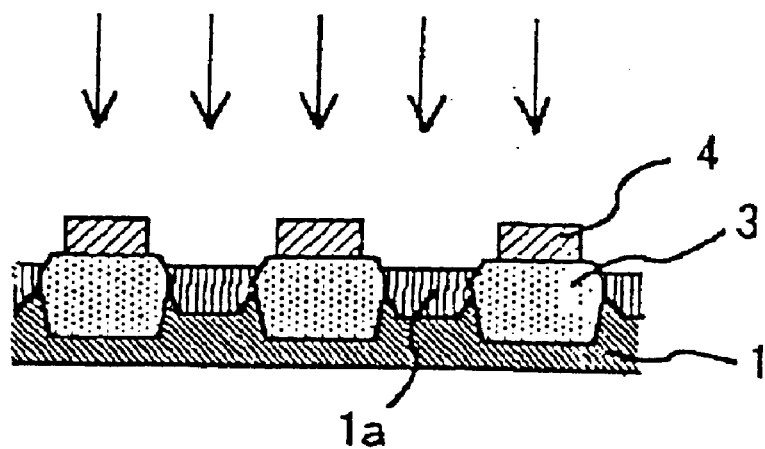

FIG. 13A is a plan view showing a case in which the polarity of a resistor 4 and the polarity of an impurity added to diffusion regions 1a are different from each other. FIG. 13B is a sectional view showing a configuration used when the impurity is implanted in the diffusion regions 1a and a configuration used when an impurity is implanted in the resistors 4. FIG. 14A is a plan view showing a case in which the polarity of a resistor 4 and the polarity of an impurity added to diffusion regions 1a are different from each other. FIG. 14B is a sectional view showing a configuration used when impurities having the same polarities are implanted in the diffusion regions 1a and the resistors 4.

In FIG. 13A and FIG. 13B, for example, the diffusion regions 1a are of an n type, and the resistors 4 consist of p-type polysilicon. In this case, boundaries which are resist layers 6 for preventing an impurity from being implanted must be arranged between the resistors 4 and the adjacent diffusion regions 1a when the impurities are implanted in the resistors 4 and the diffusion regions 1a. At this time, distance A and distance B which are set in consideration of variations of the sizes of the resist layers 6 are required between the resistors 4 and the diffusion regions 1a, and the intervals between the resistors 4 must be increased. Therefore, a wide area is required, and is disadvantageous to the layout of the IC.

In contrast, as shown in FIG. 14A and FIG. 14B, for example, the diffusion regions 1a are of a p type, and the resistors 4 consist of p-type polysilicon. In this case, since the boundaries which are the resist layers 6 are not necessary, the intervals between the resistors 4 can be reduced. Therefore, it is advantageous that a layout area of resistors in an IC can be reduced.

A seventh embodiment of the present invention will be described below with reference to FIG. 15A, FIG. 15B, and FIG. 16.

Figure 15A:
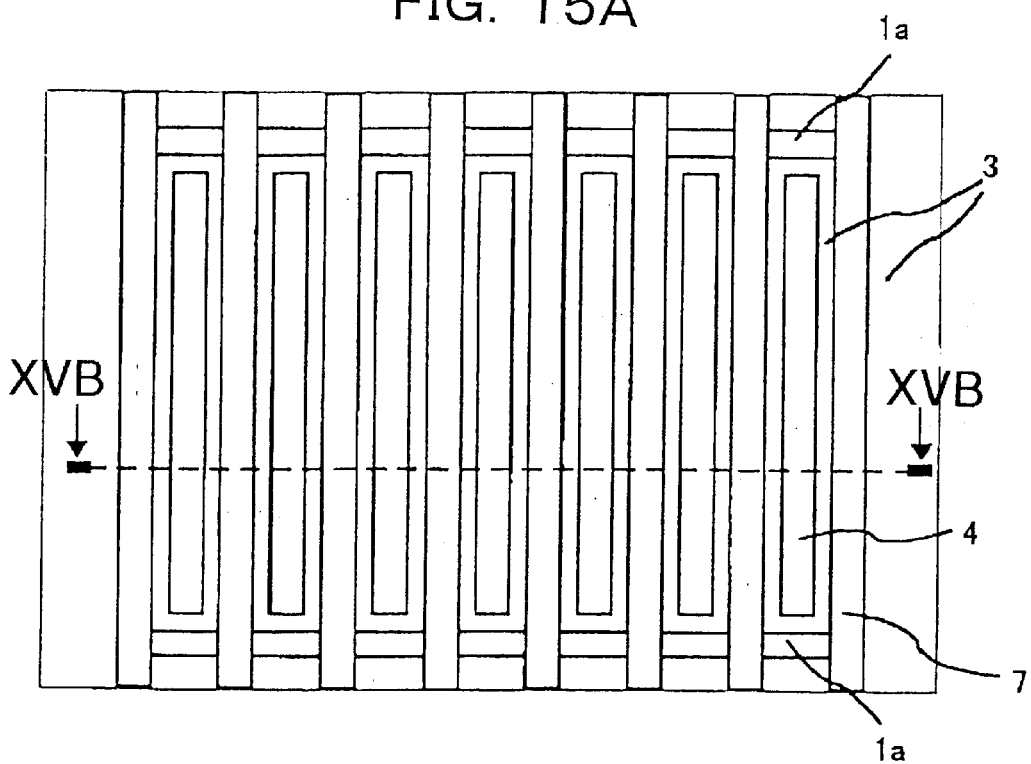
FIG. 15A and FIG. 15B are a plan view and a sectional view showing a semiconductor device according to a seventh embodiment.
Figure 15B:
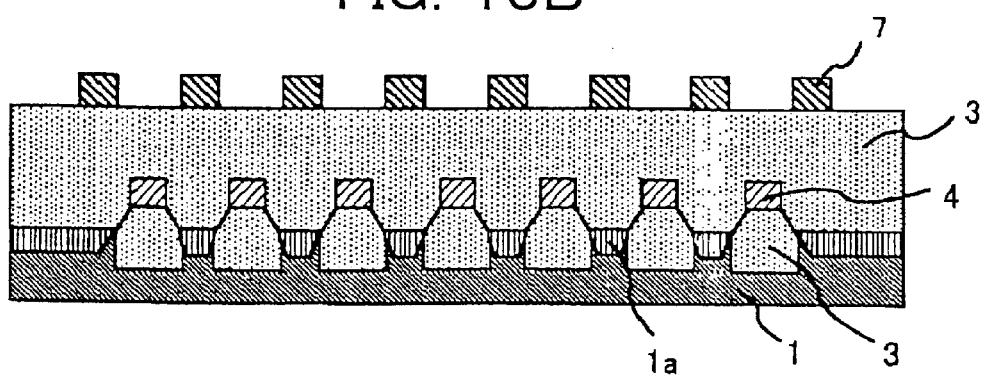

FIG. 15A is a plan view and FIG. 15B is a sectional view showing an arrangement of metal wiring layers 7 and resistors 4 in a multi-layered wiring structure. The metal wiring layers 7 are arranged between the resistors 4 as shown in FIG. 15A and FIG. 15B to make stress generated in a manufacturing operation and after the manufacturing operation uniform, so that differences between parasitic resistances to be generated can be suppressed to be small. Differences between amounts of diffused hydrogen can be suppressed to be small even though a hydrogen sinter is used. In this manner, the resistors 4 having characteristics that parasitic resistances are almost equal to each other can be accurately formed.

The metal wiring layers 7 may also be used as normal signal lines, or may also be a dummy pattern.

Figure 16:
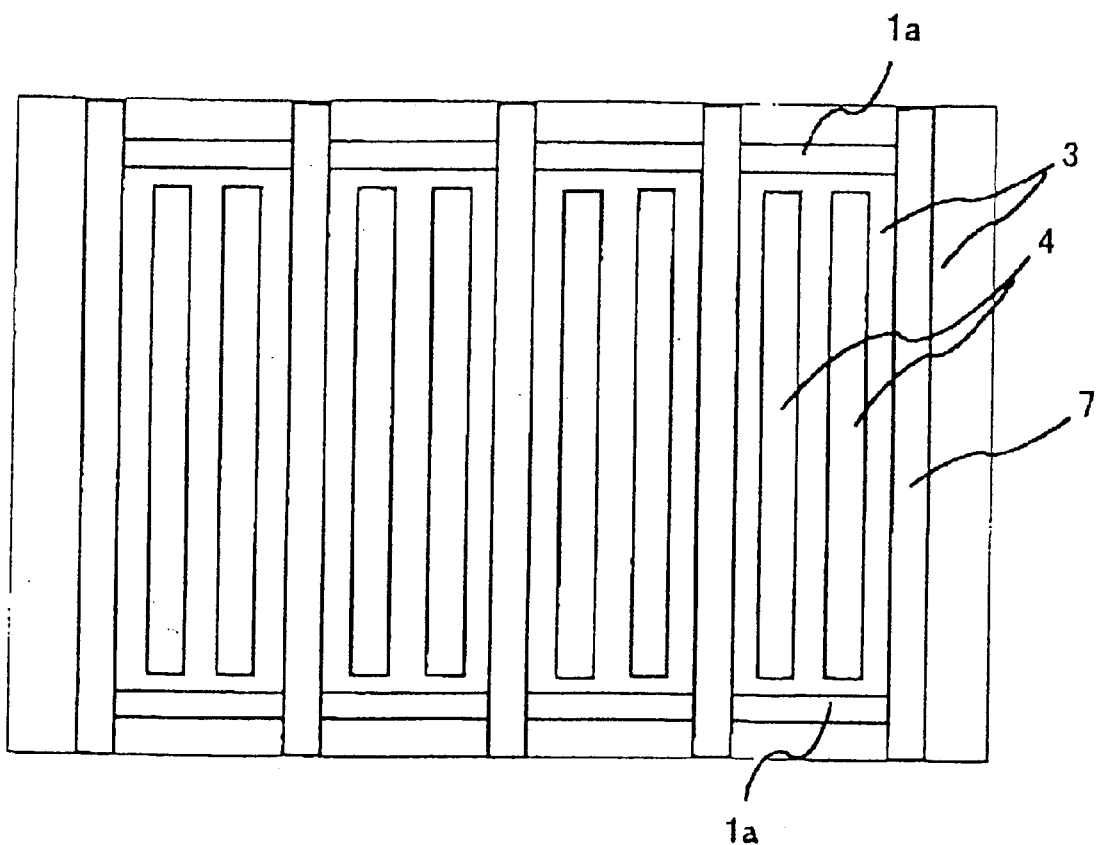
FIG. 16 is a plan view showing the semiconductor device according to the seventh embodiment 7.
Figure 17:
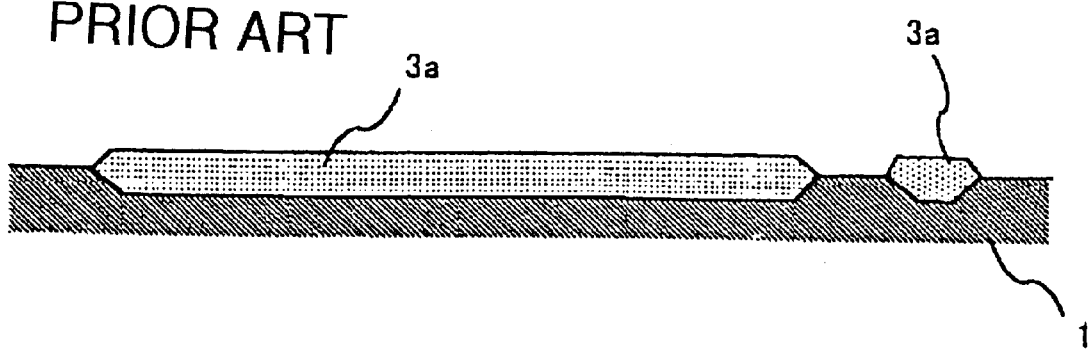
FIG. 17 is a sectional view showing a conventional element isolation layer region.

FIG. 16 is basically the same as FIG. 15A and FIG. 15B. However, two resistors 4 are considered as sub-resistors, and a resistor formed by connecting the resistors 4 in series with each other or in parallel to each other is considered as a main resistor. The metal wiring layers 7 are uniformly arranged between the main resistors to make stress generated in a manufacturing operation and after the manufacturing operation uniform, so that differences between parasitic resistances to be generated can be suppressed to be small. For this reason, as in the configuration shown in FIG. 15A and FIG. 15B, the main resistors having characteristics that parasitic resistances are almost equal to each other can be accurately formed.

Although the main resistor is constituted by the two sub-resistors 4, the main resistor may be constituted by three or more sub-resistors 4.

As has been described above, according to one aspect of the present invention, resistors having characteristics that parasitic resistors are almost equal to each other can be accurately formed.

Furthermore, a plurality of resistors having the same characteristics can be accurately formed.

Furthermore, a dent is rarely formed on the silicon oxide film 3 in a polishing process.

Furthermore, the degree of freedom of a design can be improved.

Furthermore, resistors can be more accurately formed.

Furthermore, intervals between the resistors can be reduced.

Furthermore, the influence of noise transmitted from a silicon substrate to the resistors can be reduced.

According to another aspect of the present invention, differences between parasitic resistances to be generated can be suppressed to be small.

Furthermore, conventional resistors can be applied without being changed.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising:
    a semiconductor substrate having a surface and including a plurality of element isolation regions at least partially embedded in the substrate and exposed at the surface, the element isolation regions being spaced apart from each other;
    a plurality of resistors having substantially identical characteristics, disposed on respective element isolation regions; and
    at least one diffusion region in the substrate between each adjacent pair of the resistors, wherein the resistors and the diffusion regions are arranged such that a distance between a resistor and the diffusion region closest to that resistor is equal for all of the resistors.

2. The semiconductor device according to claim 1, wherein a part of the respective element isolation regions includes a square region having a side with a length not less than 10 μm.

3. The semiconductor device according to claim 1, including a plurality of the diffusion regions, the diffusion regions having identical shapes.

4. The semiconductor device according to claim 1, including a plurality of the diffusion regions, the diffusion regions being arranged symmetrically with respect to center lines or center points of respective resistors.

5. The semiconductor device according to claim 1, including a plurality of the diffusion regions, wherein the resistors are surrounded by the diffusion regions.

6. The semiconductor device according to claim 1, wherein each resistor includes a plurality of sub-resistors.

7. The semiconductor device according to claim 6, wherein all the sub-resistors have substantially identical shapes.

8. The semiconductor device according to claim 6, wherein each resistor includes sub-resistors symmetrically arranged with respect to a center line or a center point of the resistor.

9. The semiconductor device according to claim 1, wherein the diffusion region and the resistors have identical conductivity types.

10. The semiconductor device according to claim 9, including a well region under the diffusion region, wherein the diffusion region and the well region have identical conductivity types.

11. The semiconductor device according to claim 1, wherein the resistors include polysilicon.

12. A semiconductor device comprising:
    a semiconductor substrate having a surface and including a plurality of element isolation regions at least partially embedded in the substrate and exposed at the surface, the element isolation regions being spaced apart from each other;
    a plurality of resistors having substantially identical characteristics, disposed on respective element isolation regions; and
    at least one metal wiring layer between each pair of adjacent resistors, on the substrate, wherein the resistors and the metal wiring layers are arranged such that a distance between a resistor and the metal wiring layer closest to that resistor is equal for all of the resistors.

13. The semiconductor device according to claim 12, wherein a part of the respective element isolation regions includes a square region having a side with a length not less than 10 μm.

14. The semiconductor device according to claim 12, wherein each resistor includes a plurality of sub-resistors.

15. The semiconductor device according to claim 14, wherein all the sub-resistors have substantially identical shapes.

16. The semiconductor device according to claim 14, wherein each resistor includes sub-resistors symmetrically arranged with respect to a center line or a center point of the resistor.

* * * * *